United States Patent
Park et al.

[11] Patent Number: 5,886,567
[45] Date of Patent: Mar. 23, 1999

[54] BACK BIAS VOLTAGE LEVEL DETECTOR

[75] Inventors: Jin-Seog Park, Kyungki-Do; Tae-Hoon Kim, Seoul, both of Rep. of Korea

[73] Assignee: LG Semicon Co., Ltd., Chungcheongbuk-Do, Rep. of Korea

[21] Appl. No.: 890,601

[22] Filed: Jul. 9, 1997

[30] Foreign Application Priority Data

Dec. 5, 1996 [KR] Rep. of Korea ............... 1996/61761

[51] Int. Cl.[6] ................................................. G05F 1/10
[52] U.S. Cl. ..................................... 327/537; 327/535
[58] Field of Search .................................. 327/534, 535, 327/536, 537, 77, 80, 81, 50

[56] References Cited

U.S. PATENT DOCUMENTS

| | | | |
|---|---|---|---|
| 5,013,935 | 5/1991 | Mahabadi | 307/350 |
| 5,268,595 | 12/1993 | Ohshima | 307/362 |
| 5,394,026 | 2/1995 | Yu et al. | 327/536 |
| 5,757,225 | 5/1998 | Tobita | 327/539 |

OTHER PUBLICATIONS

Roubik Gregorian, Analog MOS Integrated Circuits for Signal Processing, 1986, p. 127.

*Primary Examiner*—Timothy P. Callahan
*Assistant Examiner*—Hai L. Nguyen
*Attorney, Agent, or Firm*—Morgan, Lewis & Bockius LLP

[57] ABSTRACT

A back bias voltage level detector includes a reference voltage generator outputting a reference voltage having a constant voltage, a PMOS pull-up transistor coupled to the reference voltage generator and an external voltage and outputting a gate-source voltage of the PMOS pull-up transistor, an NMOS pull-down transistor coupled to the PMOS pull-up transistor and a back bias voltage and outputting a gate-source voltage of the NMOS pull-down transistor, a couple of inverters connected in series between the PMOS pull-up transistor and the NMOS pull-down transistor and outputting an oscillation enable signal, and a couple of resistors connected in series between the back bias voltage and a ground voltage and connected to the NMOS pull-down transistor.

6 Claims, 4 Drawing Sheets

BACK BIAS VOLTAGE LEVEL DETECTOR

This application claims the benefit of Korean Application No. 61761/1996 filed on Dec. 5, 1996, which is hereby incorporated by reference.

BACKGROUND OF THE INVENTION

1. Field of the Invention

The present invention relates to a voltage level detector, and more particularly, to a back bias voltage level detector. Although the present invention is suitable for a wide scope of applications, it is particularly suitable for constantly maintaining a back bias voltage with respect to the variation of an external voltage and enhancing a junction reliability of an NMOS pull-down transistor.

2. Description of the Related Art

FIG. 1 is a block diagram illustrating a conventional back bias voltage generator.

As shown in FIG. 1, the conventional back bias voltage generator includes a back bias voltage level detector 1 for receiving a back bias voltage $V_{BB}$ and outputting an oscillation enable signal OSCEN, a back bias voltage oscillator 2 for receiving the oscillation enable signal OSCEN and outputting a pulse signal OSC having a constant period, and a back bias voltage pump 3 for receiving the pulse signal OSC and outputting the back bias voltage $V_{BB}$.

The operation of the conventional back bias voltage generator will now be explained with reference to the accompanying drawings.

The back bias voltage level detector 1 outputs an oscillation enable signal OSCEN until the back bias voltage $V_{BB}$ becomes a predetermined level, and the back bias voltage oscillator 2 receives the oscillation enable signal OSCEN and outputs the pulse signal OSC having a predetermined period, and the back bias voltage pump 3 receives the pulse signal OSC from the back bias voltage oscillator 2 and pumps a negative electric charge to a substrate.

As shown in FIG. 2, the conventional back bias voltage level detector of FIG. 1 includes resistors R1 and R2 connected in series between a ground voltage $V_{SS}$ and a back bias voltage $V_{BB}$, a pull-up resistor R3 and an NMOS pull-down transistor N connected in series between an external voltage $V_{CC}$ and the back bias voltage $V_{BB}$, and inverters IN1 and IN2 connected to the pull-up resistor R3 and the pull-down transistor N.

A gate of the NMOS pull-down transistor N is connected between the resistors R1 and R2.

The operation of the back bias voltage level detector will now be explained with reference to the accompanying drawings.

First, the serial resistors R1 and R2 divide the back bias voltage $V_{BB}$ and bias the NMOS pull-down transistor N.

If the back bias voltage $V_{BB}$ is varied, a gate-source voltage $V_{GS1}$ of the NMOS pull-down transistor N is varied.

Here, a current $I_{R3}$ applied to the pull-up resistor R3 can be expressed as follows based on the voltage difference between the voltage V21 and the external voltage $V_{CC}$ between the pull-up resistor R3 and the NMOS pull-down transistor N.

$$I_{R3} = \frac{(V_{CC} - V21)}{R3}$$

In accordance with the above expression, the current $I_{R3}$ applied to the pull-up resistor R3 is varied with the external voltage $V_{CC}$.

If the gate-source voltage $V_{GS1}$ of the NMOS pull-down transistor N is decreased, the current $I_N$ applied to the pull-up resistor R3 is decreased. Subsequently, the current driving capacity of the NMOS pull-down transistor N is decreased, so that a node 21 becomes a high electric potential.

Here, since the oscillation enable signal OSCEN becomes the high electric potential, the back bias voltage oscillator 2, as shown in FIG. 1, outputs the pulse signal OSC.

When the pulse signal OSC is inputted to the back bias voltage pump 3, the absolute value of the back bias voltage $V_{BB}$ is increased because the negative electric charge is applied to the substrate by a pumping operation.

Therefore, the absolute value of the back bias voltage $V_{BB}$ is increased, and the gate-source voltage $V_{GS1}$ of the NMOS pull-down transistor N is increased. As a result, the current $I_N$ reaches higher than the current $I_{R3}$ applied to the pull-up resistor R3, so that the node 21 becomes a low electric potential.

Since the oscillation enable signal OSCEN is the low electric potential, the back bias voltage oscillator 2 does not output the pulse signal OSC and the back bias voltage pump 3 does not operate to pump.

FIG. 3 is illustrating another conventional back bias voltage level detector of the back bias voltage generator shown in FIG. 1. As shown in FIG. 3, another conventional back bias voltage level detector includes a PMOS pull-up transistor P substituting for the pull-up transistor R3 in the conventional back bias shown in FIG. 2. In the PMOS pull-up transistor P, a gate, source, and drain are connected to the ground voltage $V_{SS}$, the external voltage $V_{CC}$, and a drain of a NMOS pull-down transistor N, respectively.

The operation of the another conventional back bias voltage level detector will now be explained with reference to the accompanying drawings.

The resistors R1 and R2 connected in series divide the back bias voltage $V_{BB}$ and bias the NMOS pull-down transistor N. Here, if the back bias voltage $V_{BB}$ is varied, the gate-source voltage $V_{GS1}$ of the NMOS pull-down transistor N is varied. The drain current $I_P$ of the PMOS pull-up transistor P can be expressed as follows.

$$I_P = \frac{\beta}{2}(V_{GS2} - V_T)^2$$

where $V_{GS2}$ denotes the gate-source voltage of the PMOS pull-up transistor P, and the value of $V_{GS2}$ is the same as $-V_{CC}$. $V_T$ and B denote a threshold voltage and a constant, respectively.

According to the expression above, the drain current $I_P$ of the PMOS pull-up transistor P is varied with the external voltage $V_{CC}$.

When the gate-source voltage $V_{GS1}$ of the NMOS pull-down transistor N is decreased, the current $I_N$ becomes smaller than the drain current $I_P$ of the PMOS pull-up transistor P. Accordingly, since the current driving capacity of the NMOS pull-down transistor N becomes small, node 31 becomes a high electric potential.

Here, the oscillation enable signal OSCEN becomes the high electric potential, and the back bias voltage oscillator 2, as shown in FIG. 1, outputs the pulse signal OSC.

Therefore, since the pulse signal OSC is inputted to the back bias voltage pump 3, and the negative electric charge is supplied to the substrate through a pumping operation, the absolute value of the back bias voltage $V_{BB}$ is increased.

When the absolute value of the back bias voltage $V_{BB}$ is increased, the gate-source voltage $V_{GS1}$ of the NMOS pull-down transistor N is increased, and the current $I_N$ of the NMOS pull-down transistor N is increased. Thus, when the current $I_N$ of the NMOS pull-down transistor N is higher than the drain current $I_P$ of the PMOS pull-up transistor P, the node 31 becomes the low electric potential.

Therefore, the oscillation enable signal OSCEN becomes the low electric potential, and the back bias voltage oscillator 2 does not output the pulse signal OSC, and the back bias voltage pump 3 does not pump the negative electric charge to the substrate.

FIG. 4 is illustrating a relationship between the back bias voltage $V_{BB}$ and the threshold voltage $V_T$.

As shown in FIG. 4, when the absolute value of the back bias voltage $V_{BB}$ is increased, namely, the back bias voltage $V_{BB}$ has a larger negative value, the threshold voltage $V_T$ of the NMOS pull-down transistor N is increased.

Here, the threshold voltage $V_T$ can be expressed as follows.

$$V_T = V_{T0} + r\sqrt{V_{sb}}$$

where $V_{TO}$ denotes the threshold voltage in an initial state, $V_{sb}$ denotes a voltage between the source and the substrate, and r denotes a constant varying with the doping of the substrate in the value a range of 0.4<r<1.2.

Thus, the larger the absolute value of the back bias voltage $V_{BB}$, the larger the threshold voltage $V_T$. In the conventional back bias voltage level detector, a large threshold voltage slows down the operational speed of the NMOS pull-down transistor N.

Thus, the conventional back bias voltage level detector does not appropriately latch the input. Moreover, since high electric field is applied to the junction of the NMOS pull-down transistor where the high voltage $V_{BB}$ is supplied, the reliability of the system is degraded.

SUMMARY OF THE INVENTION

Accordingly, the present invention is directed to a back bias voltage level detector that substantially obviates one or more of problems due to limitations and disadvantages of the related art.

An object of the present invention is to provide a back bias voltage level detector capable of constantly maintaining a back bias voltage with respect to the variation of an external voltage and enhancing a junction reliability of an NMOS pull down transistor, so that the input is performed at the speed of the NMOS pull-down transistor since there is no variation of the threshold voltage of the NMOS transistor pull-down transistor, and it is possible to properly latch.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, a back bias voltage level detector irrespective of an external voltage includes resistors connected between a ground voltage and a back bias voltage in series, a pull-down transistor the gate of which is connected between the resistors, and the source of which is connected to the back bias voltage, a pull-up transistor the gate of which is connected to a reference voltage generator, the source of which is connected to an external voltage, and the drain of which is connected to the drain of the pull-down transistor, and inverters connected to the drain of the pull-down transistor and the drain of the pull-up transistor, respectively.

In another aspect of the present invention, a back bias voltage detector includes a reference voltage generator outputting a reference voltage having a constant voltage, a PMOS pull-up transistor coupled to the reference voltage generator and an external voltage and outputting a gate-source voltage of the PMOSs pull-up transistor, an NMOS pull-down transistor coupled to the PMOS pull-up transistor and a back bias voltage and outputting a gate-source voltage of the NMOS pull-down transistor, a couple of inverters connected in series between the PMOS pull-up transistor and the NMOS pull-down transistor and outputting an oscillation enable signal, and a couple of resistors connected in series between the back bias voltage and a ground voltage and connected to the NMOSS pull-down transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are intended to provide a further understanding of the invention and are incorporated in and constitute a part of this specification, illustrate embodiments of the invention, and together with the description serve to explain the principles of the invention.

In the drawings.

DETAILED DESCRIPTION OF THE INVENTION

Figure 3:
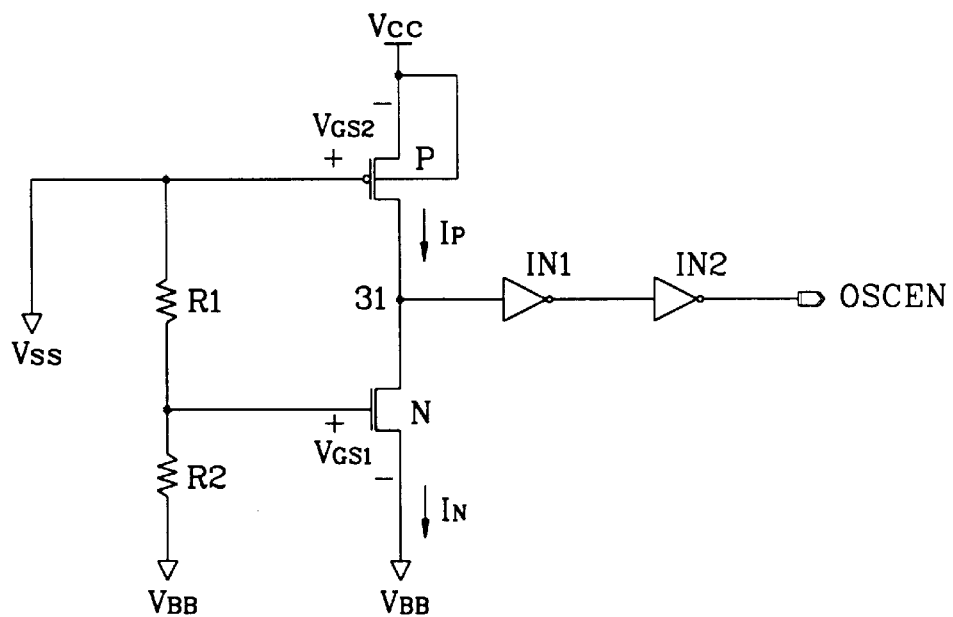
FIG. 3 is a circuit diagram illustrating another conventional back bias voltage level detector.
Figure 4:
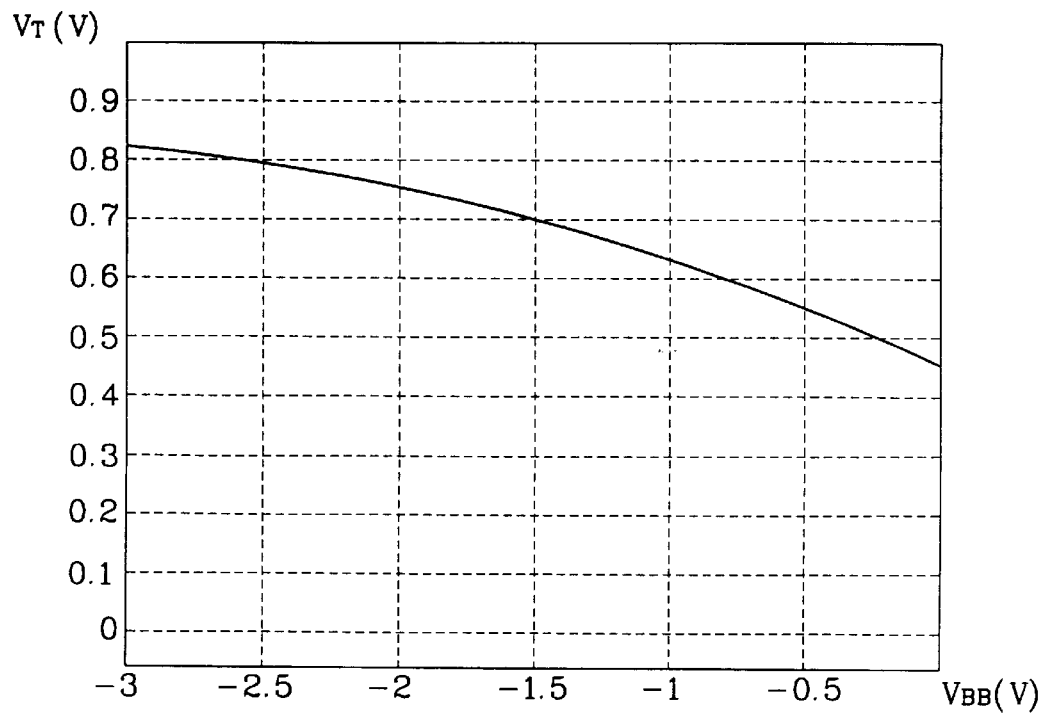
FIG. 4 is a graph illustrating a variation of a threshold voltage of an NMOS transistor with a back bias voltage shown in FIG. 3.
Figure 5:
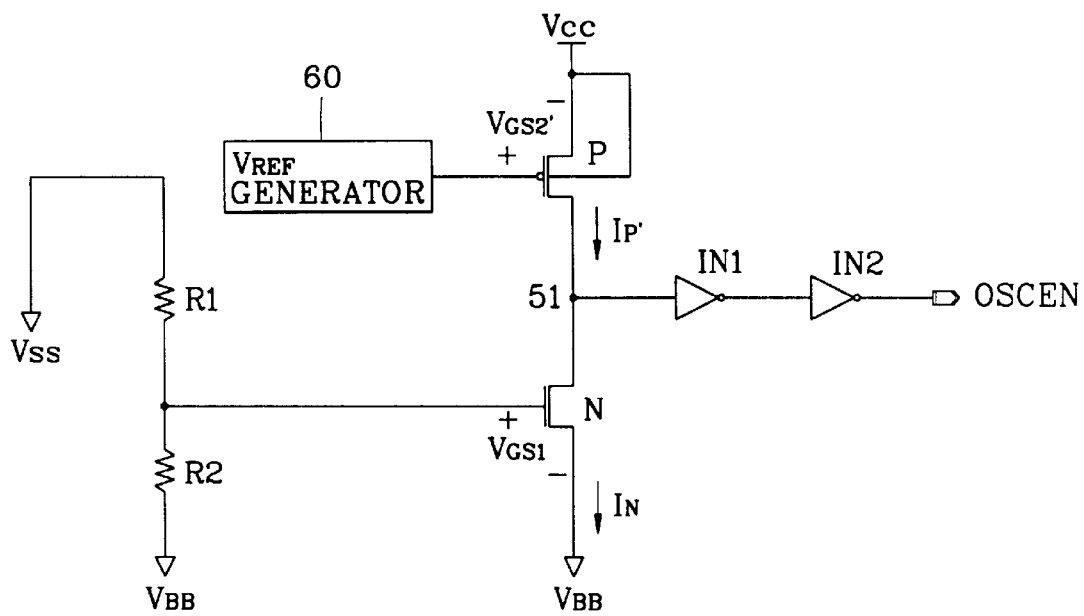
FIG. 5 is a circuit diagram illustrating a back bias voltage level detector according to the present invention.

As shown in FIG. 5, a back bias voltage level detector in the present invention includes a reference voltage generator 60 connected to the gate of a PMOS pull-up transistor P substituting for the ground voltage $V_{SS}$ of the conventional back bias voltage level detector as shown in FIG. 3.

The operation of the back bias voltage level detector according to the present invention will now be explained with reference to the accompanying drawings.

The reference voltage $V_{REF}$ having a constant voltage difference with respect to an external voltage $V_{CC}$ is connected to the gate of the PMOS pull-up transistor P. The gate-source voltage $V_{GS2}$, of the PMOS pull-up transistor P is thus constantly maintained irrespective of the external voltage $V_{CC}$.

Therefore, the drain current $I_P{}'$ of the PMOS pull-up transistor P can be expressed as follows.

$$I_P' = \frac{\beta}{2}(V_{GS2}' - V_T)^2 = \frac{\beta}{2}(V_{CC} - V_{REF} - V_T)^2$$

Since the difference $V_{CC}-V_{REF}$ is constant, it is possible to obtain constant current $I_P{}'$ irrespective of the external voltage $V_{CC}$.

In addition, resistors R1 and R2 connected in series divide the back bias voltage $V_{BB}$ and bias the NMOS pull-down transistor N.

When the gate-source voltage $V_{GS1}$ of the NMOS pull-down transistor N is decreased, the drain current $I_N$ of the NMOS pull-down transistor is also decreased. Subsequently, when the drain current $I_N$ of the NMOS pull-down transistor is decreased, the current $I_P{}'$ is also decreased. As a result, since the current driving capacity of the NMOS pull-down transistor N is decreased, a node 51 becomes the high electric potential.

Figure 1:
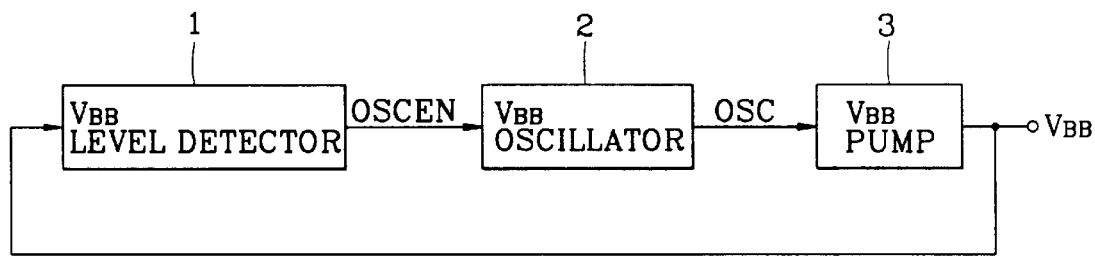
FIG. 1 is a block diagram illustrating a conventional back bias voltage generator.

Therefore, the oscillation enable signal OSCEN becomes a high electric potential, and the back bias voltage oscillator 2, as shown in FIG. 1, outputs a pulse signal OSC.

Since the pulse signal OSC is inputted to the back bias voltage pump 3, and the negative electric potential is applied to the substrate by a pumping operation, the absolute value of the back bias voltage $V_{BB}$ is increased.

Conversely, when the absolute value of the back bias voltage $V_{BB}$ is increased, the gate-source voltage $V_{GS1}$ of the NMOS pull-down transistor N and the drain current $I_N$ of the NMOS pull-down transistor are increased. Thus, when the drain current $I_N$ of the NMOS pull-down transistor is increased up to a predetermined level of the current $I_P'$, the node 51 becomes a low electric potential.

Therefore, the oscillation enable signal OSCEN becomes a low electric potential, and the back bias voltage oscillator 2 does not output the pulse signal OSC, so that the back bias voltage pump 3 does not pump the negative electric charge to the substrate.

Figure 6:
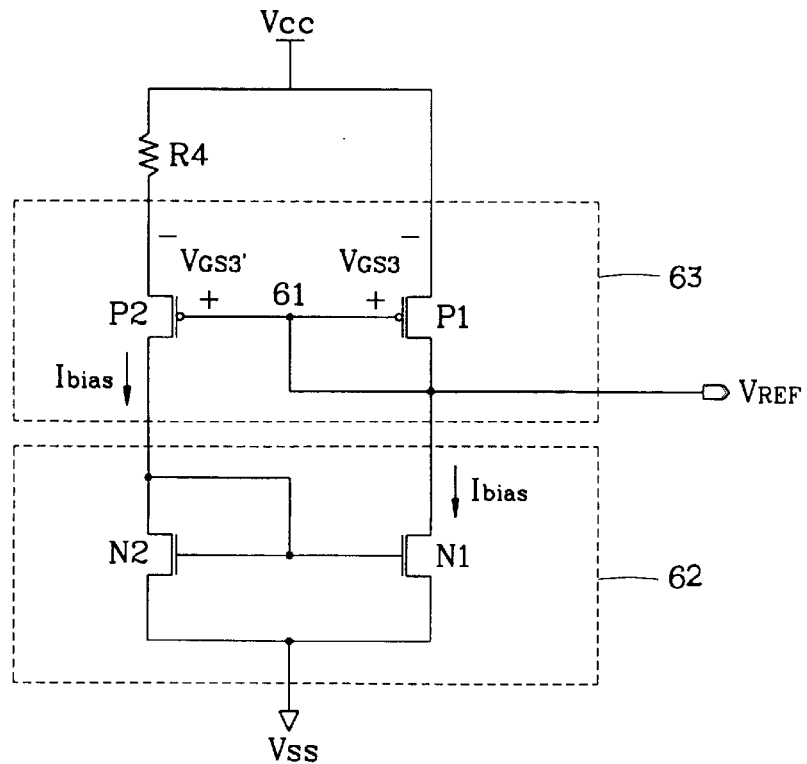
FIG. 6 is a circuit diagram illustrating a reference voltage generator of FIG. 5.

A reference voltage generator 60, shown in FIG. 6, was disclosed at page 127 in "Analog MOS Integrated Circuits for signal processing" by Roubik Gregorian and Gabor Co Temes. The reference voltage generator 60 includes an NMOS current mirror 62 having gates of first and second NMOS transistors N1 and N2 commonly connected to a drain of the second NMOS transistor N2 and sources commonly connected to a ground voltage $V_{SS}$, a PMOS current mirror 63 having the gates of first and second PMOS transistors P1 and P2 commonly connected to a drain of a first PMOS transistor P1 and a source of the first PMOS transistor P1 connected to an external voltage $V_{CC}$, and a resistor R4 connected between a source of the second PMOS transistor P2 and the external voltage $V_{CC}$.

The operation of the reference voltage generator 60 will now be explained with reference to FIG. 6.

Here, the first and second NMOS transistors N1 and N2 are identical transistors having a same characteristic. Namely, WN51=WN52, and LN51=LN52.

Therefore, in the reference voltage generator 60, the gate-source voltages of the first and second NMOS transistors N1 and N2 are identical. In addition, the drain current of the first and second NMOS transistors N1 and N2 becomes the same as the bias current $I_{bias}$ in the reference voltage generator 60.

Since the second PMOS transistor P2 is the only path where the current flows to the second NMOS transistor, the drain current of the PMOS transistor P2 becomes the same as the bias current $I_{bias}$.

The reference voltage $V_{REF}$ is outputted from a node 61 in accordance with the bias current $I_{bias}$.

The bias current $I_{bias}$ can be expressed as follows.

$$I_{bias} = \frac{(V_{GS3} - V_{GS3}')}{R4}$$

where $V_{GS3}=-V_{CC}+V_{REF}$

In accordance with the above-described expression, if the external voltage $V_{CC}$ is increased, the gate-source voltage $V_{GS3}$ of the first PMOS transistor P1 is increased. Thus, since the bias current $I_{bias}$ is increased, the reference voltage $V_{REF}$ is also increased.

Figure 7:
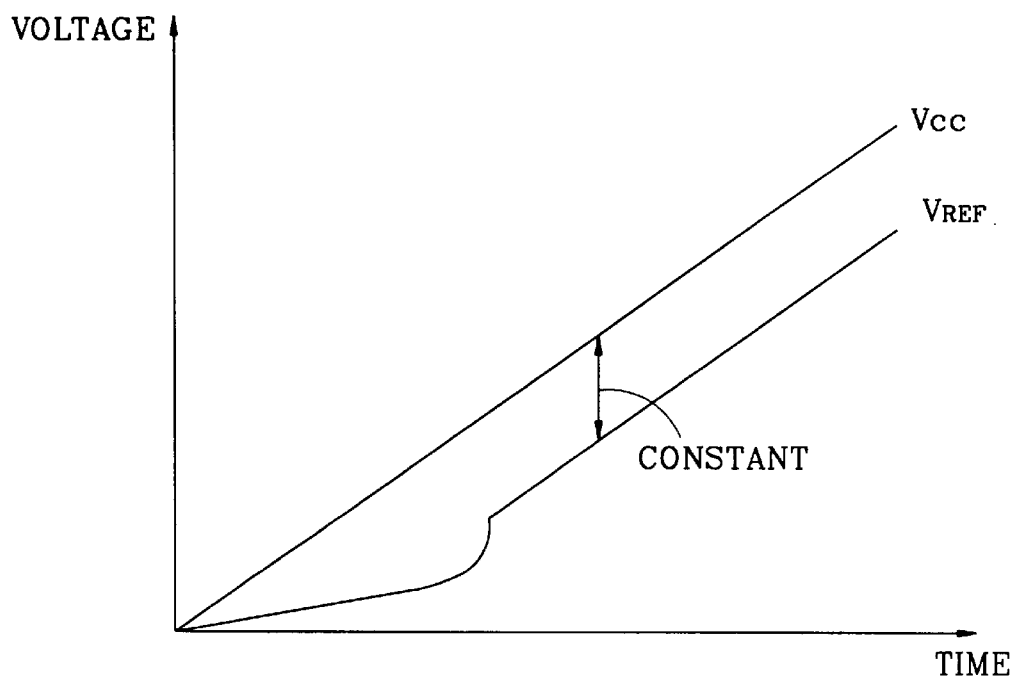
FIG. 7 is a graph illustrating the relationship between an external voltage and a reference voltage of the reference voltage generator shown in FIG. 5.

On the contrary, if the external voltage $V_{CC}$ is decreased, the gate-source voltage $V_{GS3}$ of the first PMOS transistor P1 is decreased. As a result, the reference voltage $V_{REF}$ is decreased because the bias current $I_{bias}$ is decreased. Therefore, as shown in FIG. 7, there is a constant voltage difference between the reference voltage $V_{REF}$ and the external voltage $V_{CC}$.

Figure 2:
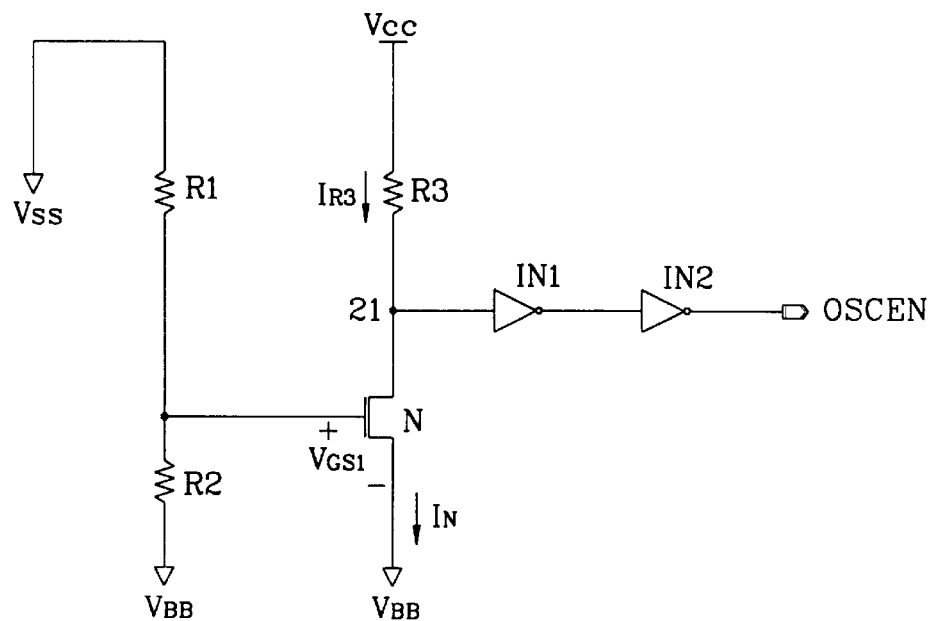
FIG. 2 is a circuit diagram illustrating a conventional back bias voltage level detector.
Figure 8:
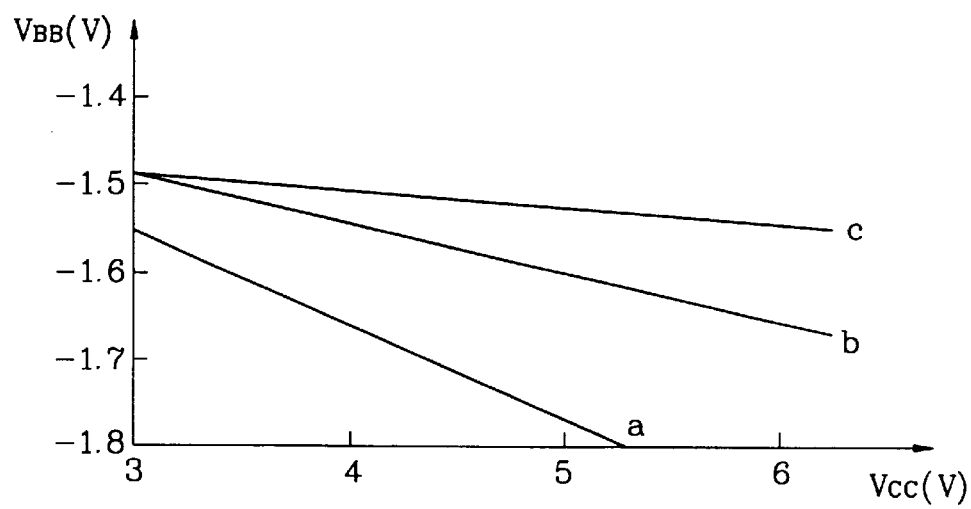
FIG. 8 is a graph illustrating the characteristics of a back bias voltage level detector based on external voltages of FIGS. 2, 3, and 5.

FIG. 8 is a graph illustrating characteristics of a back bias voltage level detector based on external voltages a, b, c of FIGS. 2, 3, and 5, respectively.

As shown in c of FIG. 8, the circuit of FIG. 5 according to the present invention has more stable back bias voltage level with respect to the variation of the external voltage $V_{CC}$ compared to the conventional circuits.

As described above, the NMOS pull-down transistor N is biased by using the reference voltage $V_{REF}$ having a predetermined voltage difference with respect to the external voltage $V_{CC}$. Thus, even if the external voltage $V_{CC}$ is varied, the threshold voltage $V_T$ of the NMOS pull-down transistor N is constantly maintained because the back bias voltage $V_{BB}$ is stable.

Therefore, according to the present invention, with increasing the absolute value of the back bias-voltage $V_{BB}$, the factors of decreasing the speed of the NMOS pull-down transistor N are eliminated, so that more stable input latching is completed. In addition, since an electric field lower than in the conventional art is applied to the NMOS pull-down junction where a higher voltage $V_{BB}$ is supplied, the reliability of the transistor is greatly improved.

It is to be understood that both the foregoing general description and the following detailed description are exemplary and explanatory and are intended to provide further explanation of the invention as claimed.

What is claimed is:

1. A back bias voltage level detector comprising:
   resistors connected in series between a ground voltage and a back bias voltage;
   a pull-down transistor having a gate connected between the resistors and a source connected to the back bias voltage;
   a pull-up transistor having a gate connected to a reference voltage generator, a source connected to an external voltage, and a drain connected to a drain of the pull-down transistor; and
   inverters connected to the drain of the pull-down transistor and the drain of the pull-up transistor.

2. The detector according to claim 1, wherein the reference voltage generator comprises:

a NMOS current mirror having gates of first and second NMOS transistors commonly connected to a drain of the second NMOS transistor and sources connected to the ground voltage;

a PMOS current mirror having gates of first and second PMOS transistors commonly connected to a drain of the first PMOS transistor and to a drain of the first NMOS transistor, a drain of the second PMOS transistor connected to the drain of the second NMOS transistor, and a source of the first PMOS transistor connected to the external voltage; and a resistor connected between the source of the second PMOS transistor and the external voltage.

3. The detector according to claim 2, wherein the reference voltage and the external voltage increase linearly with respect to time after a certain period of time, and there is a constant voltage difference between the reference voltage and the external voltage.

4. A back bias voltage level detector, comprising:

a reference voltage generator outputting a reference voltage having a constant voltage;

a PMOS pull-up transistor having a gate coupled to the reference voltage generator and a source coupled to an external voltage and outputting a gate-source voltage of the PMOS pull-up transistor;

an NMOS pull-down transistor coupled between the drain of the PMOS pull-up transistor and a back bias voltage and outputting a gate-source voltage of the NMOS pull-down transistor;

a plurality of inverters connected in series between the junction of the PMOS pull-up transistor and the NMOS pull-down transistor and outputting an oscillation enable signal; and a plurality of resistors connected in series between the back bias voltage and a ground voltage and connected to the gate of the NMOS pull-down transistor.

5. The detector according to claim 4, wherein the reference generator comprises:

an NMOS current mirror having gates of first and second NMOS transistors commonly connected to a drain of the second NMOS transistor and sources connected to the ground voltage;

a PMOS current mirror having gates of first and second PMOS transistors commonly connected to a drain of the first PMOS transistor and to a drain of the first NMOS transistor, a drain of the second PMOS transistor connected to the drain of the second NMOS transistor, and a source of the first PMOS transistor connected to the external voltage; and a resistor connected between the source of the second PMOS transistor and the external voltage.

6. The detector according to claim 4, wherein the reference voltage and the external voltage increase linearly with respect to time after a certain period of time, and there is a constant voltage difference between the reference voltage and the external voltage.

* * * * *